United States Patent
Choi

(10) Patent No.: US 6,233,198 B1
(45) Date of Patent: May 15, 2001

(54) HIGH DENSITY FLASH MEMORY DEVICE WITH IMPROVED ROW DECODING STRUCTURE

(75) Inventor: Ki-Hwan Choi, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/615,176

(22) Filed: Jul. 13, 2000

(30) Foreign Application Priority Data

Jul. 13, 1999 (KR) .................................................. 99-28257

(51) Int. Cl.[7] ...................................................... G11C 8/00
(52) U.S. Cl. .................................. 365/230.06; 365/189.11
(58) Field of Search ........................... 365/230.06, 189.11

(56) References Cited

U.S. PATENT DOCUMENTS 5,896,340 * 4/1999 Wong et al. .................... 365/230.06
5,999,479 * 12/1999 Park et al. ...................... 365/230.06
6,064,618 * 5/2000 Kuriyama et al. .............. 365/230.06

* cited by examiner

Primary Examiner—Trong Phan
(74) Attorney, Agent, or Firm—Marger Johnson & McCollom, P.C.

(57) ABSTRACT

Disclosed herein is a flash memory device that includes an improved row decoder structure. The row decoder circuit includes a row global decoder, a row partial decoder, a row local decoder, and a block decoder. The row local decoder includes drivers corresponding to local word lines. Each of the drivers includes MOS transistors to drive a corresponding local word line with a word line voltage necessary for each of the read, program, and erase operations. Since a limited number of driver transistors are utilized, the row decoding structure utilizes a smaller area in a circuit die than conventional decoding structures.

16 Claims, 3 Drawing Sheets

HIGH DENSITY FLASH MEMORY DEVICE WITH IMPROVED ROW DECODING STRUCTURE

This application claims priority from Korean Patent Application No. 1999-28257, filed on Jul. 13, 1999, the contents of which are incorporated herein by reference in its entirety.

FIELD OF THE INVENTION

The present invention is related to semiconductor memory devices and, more particularly, to a NOR-type flash memory device with a row decoding structure that occupies a smaller area in a semiconductor integrated circuit die than conventional decoding structures.

BACKGROUND OF THE INVENTION

A memory cell unit of electrically erasable and programmable NOR-type flash memory devices has source and drain electrodes formed in a p-type semiconductor substrate, a floating gate electrode formed over a channel region between the source and drain electrodes with an insulator interposed therebetween, and a control gate electrode formed over the floating gate with another insulator interposed therebetween. The control gate electrode is connected to a word line.

The memory cell unit is programmed under a bias condition. The bias condition typically involves a ground voltage (e.g., 0V) applied to the memory cell's source electrode and substrate, a high voltage (e.g., +10V) applied to its control gate electrode, and a positive voltage (e.g., +5V to +6V) suitable for generating hot electrons applied to its drain electrode. The bias condition results in a sufficient amount of negative charges being accumulated in the floating gate electrode to thereby create a (−) potential in the floating gate electrode. The (−) potential forces the threshold voltage of the programmed cell to be increased during a read operation.

During the read operation where a voltage of about +5V is applied to the control gate electrode and a ground voltage is applied to the source electrode, the drain-source path of the programmed cell unit is nonconductive. At this time, the memory cell unit has an "OFF" state, and its threshold voltage is distributed between +6V to +7V.

The memory cell unit is erased by the Fowler-Nordheim (F-N) tunneling mechanism. The F-N tunneling mechanism functions as follows. A negative high voltage (e.g., −10V) applied to the control gate electrode and a positive voltage (e.g., +5V to +6V) suitable to induce the F-N tunneling is applied to the semiconductor substrate. The source and drain electrodes are maintained at a floating, state. The erase operation of such a bias condition is referred to as "Negative Bulk and Gate Erase" operation. The bias condition creates a strong electric field of 6 to 7 MV/cm between the control gate electrode and the semiconductor substrate. As a result, negative charges accumulated in the floating gate electrode are discharged in the source electrode through the insulator. The insulator typically has a thickness of about 100 angstrom. The discharge of negative charges lower the threshold voltage of the erased cell during the read operation.

During the read operation where a voltage of about +5V is applied to the control gate electrode and a ground voltage is applied to the source electrode, the drain-source path of the programmed cell unit is conductive. At this time, the memory cell unit has an "ON" state and its threshold voltage is between +1V to +3V.

As is well known in the art, the memory cell array of the NOR-type flash memory device is divided into a plurality of sectors. The bulk region of the each sector is electrically isolated. The memory cells integrated in each sector are simultaneously erased during an erase operation. A typical NOR-type flash memory device having a sector structure and a row decoder circuit are disclosed in entitled "A 3.3 V-only, 16 Mb Flash Memory with Row-Decoding Scheme" IEEE International Solid State Circuits, vol. 2, pp. 42–43 (1996), which is hereby incorporated by reference. The structure of the flash memory device disclosed in the reference is illustrated in FIG. 1. The capacity of the memory cell array 10 illustrated in FIG. 1 is 16 Mb and the array is divided into 32 uniform sectors (or blocks), e.g., 12, 14, and 16, each having the capacity of 0.5 Mb (512 colums*1024 rows). The rows (i.e., word lines) and the columns (i.e., bit lines) of each sector are selected independently from each other. This architecture allows disturbance-free program/erase operations, resulting in high reliability.

FIG. 2 is a circuit diagram of a row decoder circuit 20 disclosed in the aforementioned reference. The row decoder circuit 20 includes a row global decoder 22, a row partial decoder 24, a row local decoder 26 and a block decoder 28. Various word line voltages depending on read/program/erase operations are transferred to individual word line(s). The row local decoder 26 includes two transfer gates TG1 and TG2 arranged so as to correspond to the respective word lines. The transfer gate TG1 comprises PMOS transistors and NMOS transistor N1 similarly, the transfer gate TG2 comprises PMOS-transistors P2 and NMOS transistor N2. The word lines are coupled to corresponding outputs from the row partial decoder 24 through the row local decoder 26 in accordance with signals on the global word lines, e.g., word lines 30 and 32, during the program/read operation. All of the word lines are connected to the output from the block decoder 28 through the row local decoder 26.

A problem arises when the row decoder circuit 20 is used in a high-density flash memory device. The structure of the row decoder circuit 26 is inappropriate to the flash memory device when the density of the memory device is increased. Four MOS transistors, e.g., P1, N1, P2 and N2, are required for each word line (or a local word line) to select and drive the selected word line. Furthermore, the transistors coupled to each local word line load the word line during read/program/erase operations, resulting in operating speed loss.

SUMMARY OF THE INVENTION

It is an object of the present invention to overcome the problems associated with prior art memory devices.

It is another object of the present invention to provide a row decoder circuit for a flash memory device that can occupy a smaller area in an integrated circuit die than a conventional decoder circuit.

In order to attain the above objects, a nonvolatile semiconductor memory device having a hierarchical word line structure is provided. The semiconductor memory device comprises a sector having a plurality of memory cells coupled to corresponding local word lines. A global word line selecting circuit having a first global decoder and a second global decoder, the first global decoder generating an odd-numbered global word line and the second global decoder generating an even-numbered global word lines. A plurality of first local decoders is coupled to the odd-numbered global decoder. Each first local decoder drives one of the plurality of local word lines with a word line voltage responsive to the odd-numbered global word line. A plurality of second local decoders is coupled to the even-numbered global decoder. Each second local decoder drives another of the plurality of local word lines with the word line voltage responsive to the even-numbered global word line is selected.

Each first local decoder includes a plurality of first drivers coupled to a first subset of the plurality of local word lines first each driver including a first pull-up transistor and a first pull-down transistor. Each second local decoder includes a plurality of second drivers coupled to a second subset of the plurality of local word lines, each second driver including a second pull-up transistor and a second pull-down transistor.

The first pull-up transistor connects a local word line from the first subset to a row partial decoder responsive to the even-numbered global word line. The first pull-down transistor connects the local word line from the first subset to a block decoder responsive to the even-numbered global word line. The second pull-up transistor connects a local word line from the second subset to the row partial decoder responsive to the odd-numbered global word line. The second pull-down transistor connects the local word line from the second subset to the block decoder responsive to the odd-numbered global word line.

BRIEF DESCRIPTION OF THE DRAWINGS

The foregoing and other objects, features, and advantages of the invention will become more readily apparent from the following description of an exemplary preferred embodiment that proceeds with reference to the following drawings. Like references denote similar elements throughout the drawings.

DESCRIPTION OF THE PREFERRED EMBODIMENT

Figure 3:
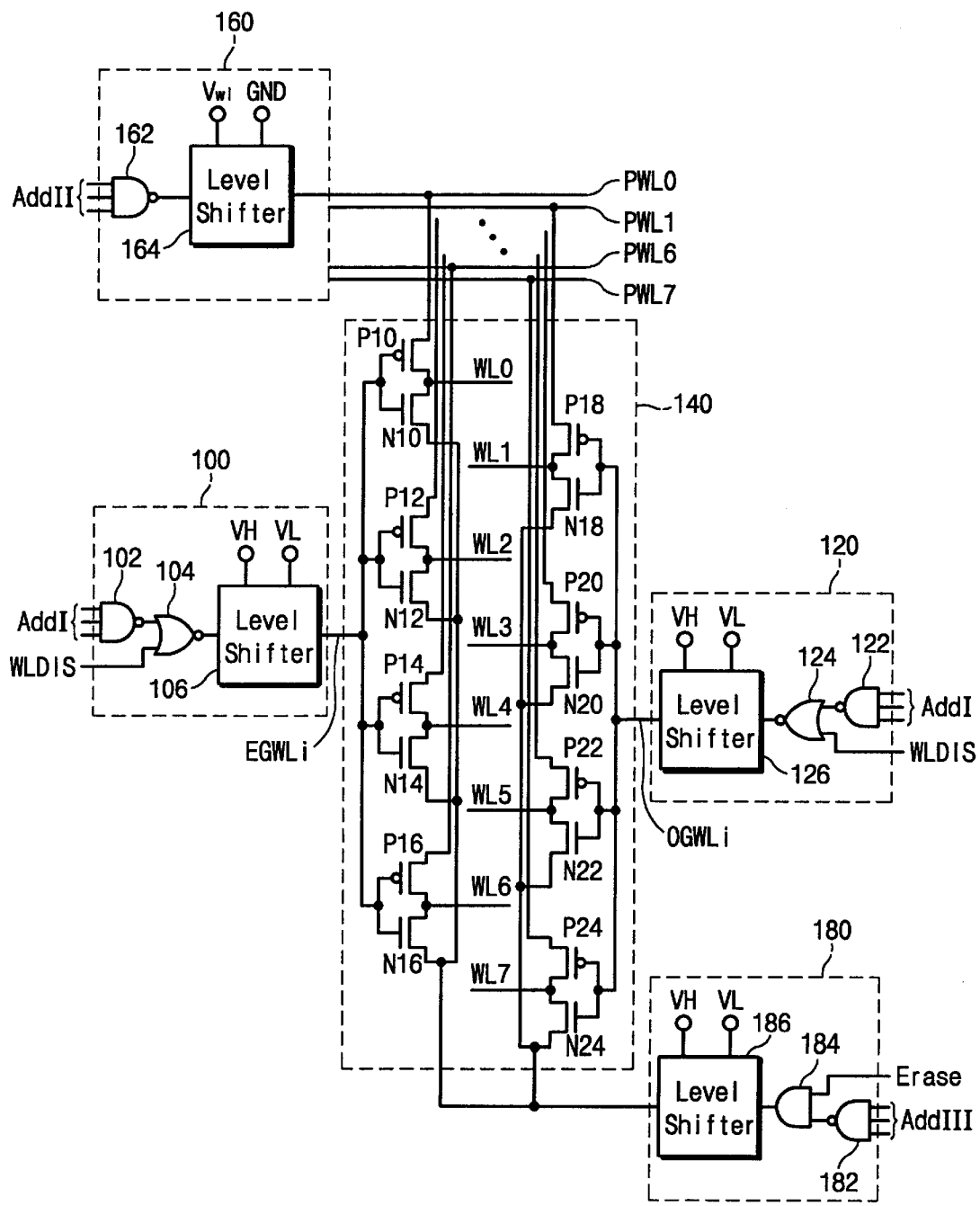
FIG. 3 is a circuit diagram of a preferred embodiment of a row decoder circuit according to the present invention.

The row decoder circuit shown in FIG. 3 can be incorporated in a flash memory device having a hierarchical word line scheme or a word line division scheme. Although not shown in the drawing, a plurality of global word lines extends along sectors arranged in the same direction. Each sector includes a plurality of local word lines associated hierarchically with the global word lines.

The row decoder circuit in FIG. 3 includes an even-numbered row global decoder 100, an odd-numbered global decoder 120, a row local decoder 140, a row partial decoder 160, and a block decoder 180. The row decoder circuit shown in FIG. 3 is configured with two global word lines EGWLi and OGWLi and eight local word lines WL0 to WL7.

The even-numbered row global decoder 100 includes a NAND gate 102, a NOR gate 104, and a level shifter 126 connected as illustrated in FIG. 3. The even-numbered row global decoder 100 drives a corresponding global word line EGWLi with a high or low voltage VH or VL, respectively, responsive to an address AddI. Silmilarly, the odd-numbered row global decoder 120 includes a NAND gate 122, a NOR gate 124 and a level shifter 126 connected as illustrated in FIG. 3. The odd numbered row global decoder 120 drives a corresponding global word line OGWLi. The even-numbered and odd-numbered global decoders 100 and 120, respectively, constitute a global word line selecting circuit.

The row local decoder 140 includes eight drivers. A first group of drivers are connected respectively to the local word lines WL0, WL2, WL4 and WL6 that correspond to the even-numbered global word line EGWLi. A second group of drivers are connected respectively to the local word lines WL1, WL3, WL5 and WL7 that correspond to the odd-numbered global word line OGWLi. Each driver includes a PMOS transistor and an NMOS transistor, e.g., P10 and N10, respectively.

The PMOS transistors P10, P12, P14, and P16 in the first group of drivers have their source electrodes coupled to corresponding word line selection signals PWL0, PWL2, PWL4, and PWL6 output from the row partial decoder 160, their gate electrodes commonly coupled to the even-numbered global word line EGWLi, and their drain electrodes coupled to the corresponding local word lines WL0, WL2, WL4, and WL6. The NMOS transistors N10, N12, N14, and N16 in the first group of drivers have their drain electrodes coupled to the corresponding local word lines WL0, WL2, WL4, and WL6, their gate electrodes commonly coupled to the even-numbered global word line EGWLi, and their source electrodes commonly coupled to the block decoder 180.

Continuing to refer to FIG. 3, the PMOS transistors P18, P20, P22, and P24 in the second group of drivers have their source electrodes coupled to the corresponding word line selection signals PWL0, PWL2, PWL4, and PWL6, their gate electrodes commonly coupled to the odd-numbered global word line OGWLi, and their drain electrodes coupled to the corresponding local word lines WL1, WL3, WL5, and WL7. The NMOS transistors N18, N20, N22, and N24 in the second group of drivers have their drain electrodes coupled to the corresponding local word lines WL1, WL3, WL5, and WL7, their gate electrodes commonly coupled to the odd-numbered global word line OGWLi, and their source electrodes commonly coupled to the block decoder 180.

The row partial decoder 160 includes a NAND gate 162 and a level shifter 164 connected as illustrated in FIG. 3. The decoder 160 drives a selected word line selection signal with a voltage Vwl and the remaining word line selection signals with a voltage GND during the program/read operations responsive to address AddII. The block decoder 180 includes a NAND gate 182, an AND gate 184, and a level shifter 186 connected as illustrated in FIG. 3. The block decoder 180 drives the local word lines WL0 to WL7 with a voltage VL through the row local decoder 140 responsive to an address signal AddIII during an erase operation.

Table 1 shows exemplary voltages at the programming, reading and erasing. A person skilled on the art should recognize other possible voltages for Vwe, VH, and VL.

TABLE 1

|  | READ | PROGRAM | ERASE |
| --- | --- | --- | --- |
| Vwl | +5V | +10V | +5V |
| VH | +5V | +10V | GROUND |
| VL | GROUND | GROUND | −10V |

The operation of the row decoder circuit according to the present invention will be more fully described with reference to the accompanying drawing.

During a read/program operation, the even-numbered row global decoder 100 drives the even-numbered global word line EGWLi with the voltage VL of a ground voltage (0V) responsive to the address AddI. The odd-numbered row global decoder 120 drives the odd-numbered global word line OGWLi with the voltage VH in also responsive to the address AddI. As seen from the above table, the voltage VL is 0V at reading/programming and the voltage VH is +5V at reading and +10V at programming. Therefore, the PMOS transistors P10, P12, P14, and P16 in the first group of drivers are turned on while the NMOS transistors N10, N12, N14, and N16 are turned off. Conversely, the PMOS transistors P18, P20, P22, and P24 in the second group of drivers are turned off and the NMOS transistors N18, N20, N22, and N24 are turned on. As a result, the local word lines WL0, WL2, WL4, and WL6 are coupled to the signal lines PWL0, PWL2, PWL4, and PWL6 respectively, through the turned-on PMOS transistors P10, P12, P14, and P16. Similarly, the local word lines WL1, WL3, WL5, and WL7 are coupled to the output of the block decoder 180 through the turned-on NMOS transistors N18, N20, N22, and N24.

The row partial decoder 160 one of the word line selection signals PWL0 to PWL7 with the voltage Vwl and the remaining word line selection signals with the voltage GND responsive to the address AddII. For example, assuming that the local word line WL0 is selected. The word line selection signal PWL0 is driven with the voltage Vwl and the remaining selection signals PWL1 to PWL7 are driven with the voltage GND. The block decoder 180 outputs a voltage VL responsive to the address AddIII during the read/program operations.

As a result, in connection with the even-numbered global word line EGWLi, the local word line WL0 is coupled to the signal line PWL0 through the PMOS transistor P10 and the local word lines WL2, WL4, and WL6 are coupled to the selection signal lines PWL2, PWL4, and PWL6 through corresponding PMOS transistors P12, P14, and P16. And, in connection with the odd-numbered global word line OGWLi, the local word lines WL1, WL3, WL5, and WL7 are coupled to the block decoder 180 through the corresponding NMOS transistors N18, N20, N22, and N24. As shown in Table 1 the voltages Vwl and VH are set +5V and the voltage VL is grounded during the read operation. Therefore, the voltage Vwl of +5V (during reading) or +10V (during programming) is transferred to the local word line WL0 and the ground voltage is transferred to the local word lines WL1, WL3, WL5, and WL7 during reading and programming, respectively. During a read operation, the local word lines WL2, WL4, and WL6 are maintained at a floating state. Although unselected local word lines are maintained at the floating state, they are not capacitively coupled to selected local word line that is driven with the voltage Vwl. This is because the unselected local word lines are shielded by the grounded local word lines.

In the case that another one of the local word lines corresponding to the even-numbered global word line EGWLi is selected, the voltage of the previously selected local word line (e.g., WL0) is discharged responsive to a discharge signal WLDIS. In particular, the row global decoder 100 drives the word line EGWLi with the voltage VH responsive to the discharge signal WLDIS. Since the NMOS transistors N10, N12, N14, and N18 are turned on, the voltage Vwl of the selected local word line WL0 is discharged through the NMOS transistor N10. The discharge signal WLDIS is preferably a pulse signal generated when a row address transitions. The discharge signal preferably has a pulse width of several nanoseconds in duration.

During the erase operation, the row global decoders 100 and 120 drive corresponding global word lines EGWLi and OGWLi with the voltage VH. The block decoder 180 outputs the voltage VL. Therefore, the voltage VL of −10V is applied to the local word lines WL0 to WL7 through corresponding NMOS transistors N10 to N24.

Figure 1:
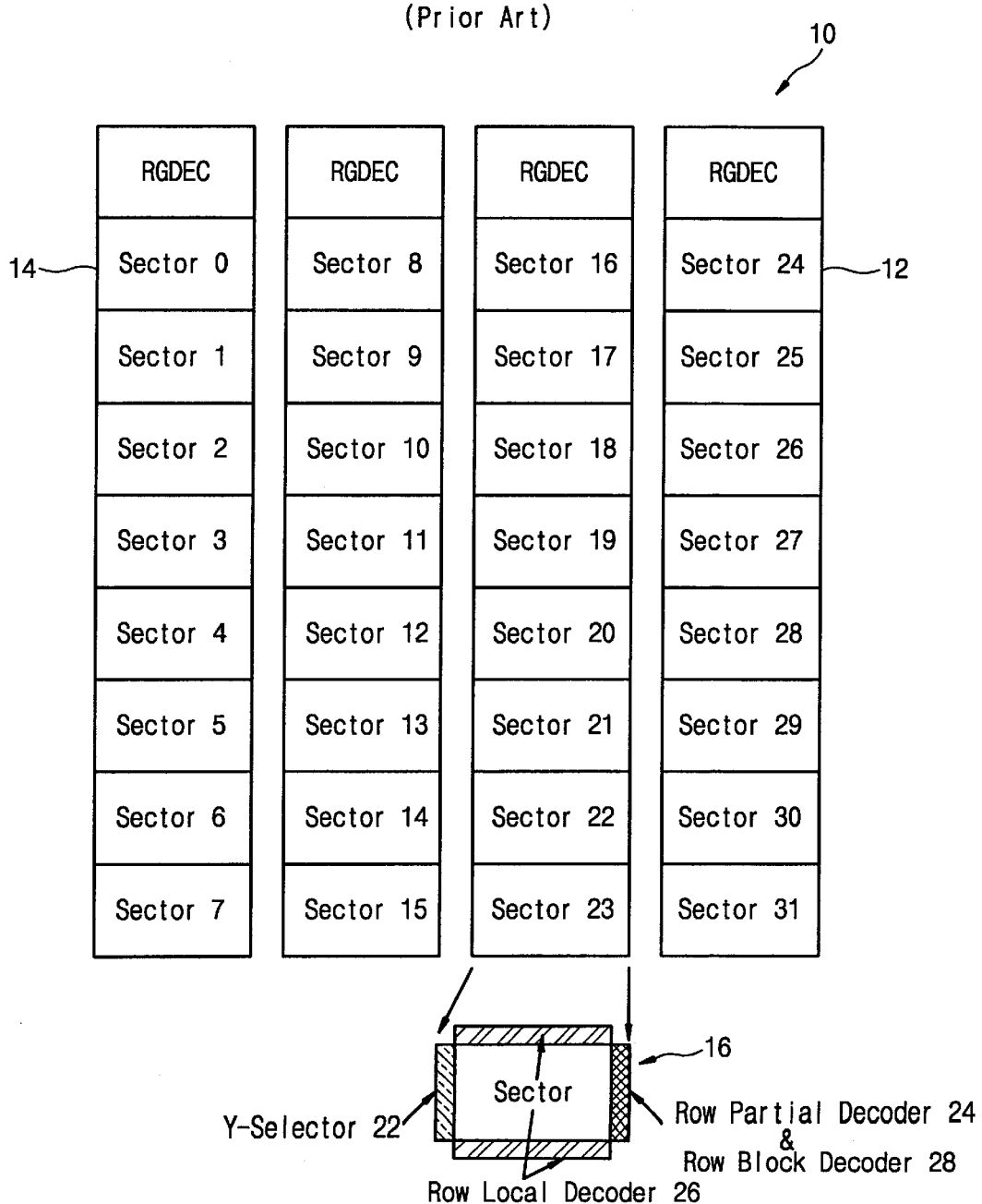
FIG. 1 is a block diagram of a memory array in a typical prior art flash memory device.
Figure 2:
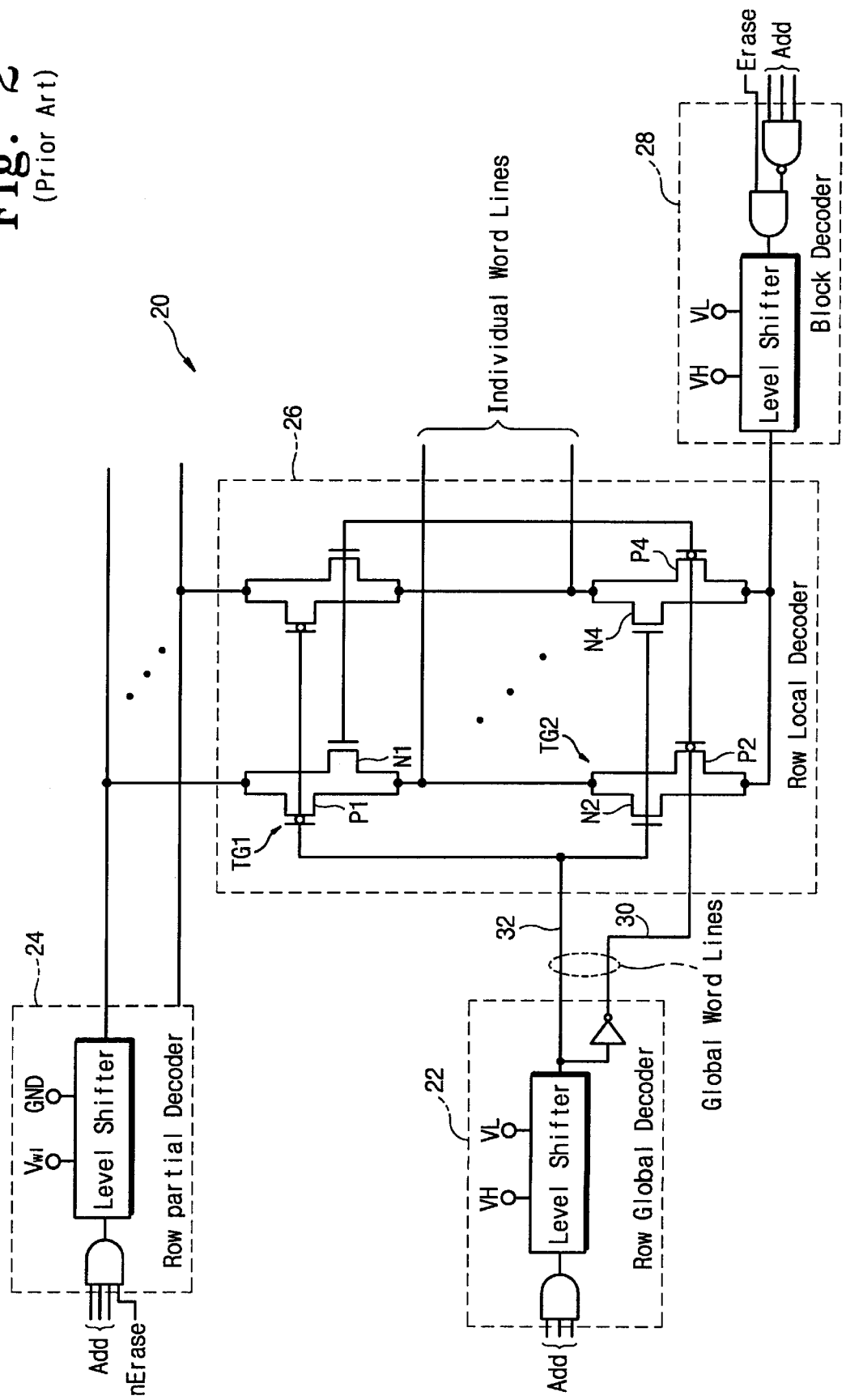
FIG. 2 is a circuit diagram of the row decoder circuit shown in FIG. 1.

According to the present invention, since only two MOS transistors are required to each local word line, the area occupied by the row local decoder is cut in half relative to the prior art decoder shown in FIGS. 1–2. Therefore, the row decoder circuit of the present invention is appropriate to high-density flash memory devices. Furthermore, loading of respective local word lines is reduced increasing operating speed.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device having a hierarchical word line structure, comprising:

a plurality of memory cells coupled to a corresponding plurality of local word lines;

a global word line selecting circuit having a first global decoder and a second global decoder, the first global decoder generating an odd-numbered global word line and the second global decoder generating an even-numbered global word line;

a plurality of first local decoders coupled to the odd-numbered global decoder, each first local decoder driving one of the local word lines with a word line voltage when the odd-numbered global word line is selected; and a plurality of second local decoders coupled to the even-numbered global decoder, each of the second local decoders driving another of the local word lines with the word line voltage when the even-numbered global word line is selected;

wherein each first local decoder includes a plurality of first drivers coupled to a first subset of the plurality of local word lines first each driver including a first pull-up transistor and a first pull-down transistor;

wherein each second local decoder includes a plurality of second drivers coupled to a second subset of the plurality of local word lines, each second driver including a second pull-up transistor and a second pull-down transistor;

wherein the first pull-up transistor connects a local word line from the first subset to a row partial decoder responsive to the even-numbered global word line;

wherein the first pull-down transistor connects the local word line from the first subset to a block decoder responsive to the even-numbered global word line;

wherein the second pull-up transistor connects a local word line from the second subset to the row partial decoder responsive to the odd-numbered global word line; and wherein the second pull-down transistor connects the local word line from the second subset to the block decoder responsive to the odd-numbered global word line.

2. The memory device of claim 1 wherein the row partial decoder generates a read and program word line voltages and wherein the block decoder generates an erase voltage.

3. The memory device of claim 1 wherein the first subset of word lines is alternatively arranged with the second subset of word lines.

4. The memory device of claim 1 wherein a word line from the first subset and a word line from the second subset are continuously selected and wherein a voltage on a previously selected local word line from each of the first and second subsets is discharged through the first and second pull-down transistors, respectively.

5. The memory device of claim 1 wherein the first and second pull-down transistors are simultaneously turned on responsive to a discharge signal, the discharge signal being generated responsive to an address for generating the even and odd-numbered global word lines, respectively.

6. The memory device of claim 1 wherein when the odd-numbered and even-numbered global word line select corresponding local word lines, unselected word lines are grounded.

7. The memory device of claim 1 wherein when one of the local word lines is driven with the word line voltage, the rest of the corresponding local word lines are maintained at a floating state.

8. A NOR-type flash memory device having a plurality of memory cell sectors, first word lines arranged at each sector, and second word lines arranged in a hierarchical relationship with the first word lines, the memory device comprising:
 a word line selecting circuit including a first word line decoder adaptable to select one of odd-numbered second word lines and a second word line decoder adaptable to select one of even-numbered second word lines; and
 a word line driving circuit including a plurality of first word line driver blocks corresponding to the odd-numbered second word lines and a plurality of second word line driver blocks corresponding to the even-numbered second word lines;
 wherein each of the first word line driver blocks drives a corresponding first word line when a corresponding odd-numbered second word line is selected; and
 wherein each of the second word line driver blocks drives a corresponding first word line when a corresponding even-numbered second word line is selected;
 wherein each of the first and second word line driver blocks includes a plurality of drivers coupled to corresponding first word lines, each driver including a PMOS transistor and an NMOS transistor;
 wherein the PMOS transistor includes a first electrode connected to a row partial decoder, a second electrode connected to a corresponding first word line, and a gate electrode connected to receive a corresponding second word line; and
 wherein the NMOS transistor includes a first electrode connected to the corresponding first word line, a second electrode connected to a block decoder, and a gate connected to receive a corresponding second word line.

9. The flash memory device of claim 8 wherein the row partial decoder generates a word line voltage necessary for each of read and program operations.

10. The flash memory device of claim 8 wherein first word lines corresponding to each of the even-numbered second word lines are alternatively arranged with first word lines corresponding to odd-numbered second word lines.

11. The flash memory device of claim 8 wherein:
 a first word line is sequentially selected by each of the odd and even-numbered word lines, a voltage of a previously selected word line being discharged through the NMOS transistor of a corresponding driver; and
 first word lines corresponding to each of unselected second word lines are grounded when one of the second word lines is selected.

12. The flash memory device of claim 8 wherein when one of first word lines corresponding to the selected second word line is driven with the word line voltage, the rest of the first word lines are maintained at a floating state.

13. A NOR-type flash memory device comprising:
 first through eighth local word lines;
 an odd-numbered global word line corresponding to the first through fourth local word lines;
 an even-numbered global word line corresponding to the fifth through eighth local word lines, the first through fourth local word lines being alternately arranged with the fifth through eighth local word lines;
 a row partial decoder for generating word line select signals corresponding to the first through eighth local word lines;
 a local word line selecting circuit having an odd-numbered global decoder for selecting an odd-numbered global word line and an even-numbered global decoder for selecting an even-numbered global word line; and
 a plurality of drivers corresponding to the first through eighth local word lines, each driver including a PMOS transistor having a source electrode connected to a corresponding word line select signal, a gate electrode connected to a corresponding global word line, and a drain electrode connected to a corresponding local word line, and an NMOS transistor having an drain electrode connected to the corresponding local word line, a gate electrode connected to the corresponding global word line, and a source electrode connected to a block decoder.

14. The flash memory device of claim 13 wherein a local word line is sequentially selected by each of the odd-numbered and even-numbered global word lines, a voltage of a previously selected local word line is discharged through the NMOS transistor of a corresponding driver.

15. The flash memory device of claim 13 wherein when one of the odd-numbered and even-numbered global word lines is selected, local word lines corresponding to unselected global word lines are grounded.

16. The flash memory device of claim 13 wherein when a local word line selected by each of the odd-numbered and even-numbered global word lines is driven with a word line voltage generated by a row partial decoder, the remaining local word lines are maintained at a floating state.

* * * * *

UNITED STATES PATENT AND TRADEMARK OFFICE
CERTIFICATE OF CORRECTION

PATENT NO. : 6,233,198 B1
DATED : May 15, 2001
INVENTOR(S) : Choi

It is certified that error appears in the above-identified patent and that said Letters Patent is hereby corrected as shown below:

<u>Column 3,</u>
Line 32, "typical prior art flash memory" should read -- typical flash memory --.

Signed and Sealed this

Nineteenth Day of March, 2002

Attest:

Attesting Officer

JAMES E. ROGAN
*Director of the United States Patent and Trademark Office*